(12) United States Patent
Sonoda et al.

(10) Patent No.: US 9,953,998 B2
(45) Date of Patent: Apr. 24, 2018

(54) SEMICONDUCTOR MEMORY DEVICE AND METHOD FOR MANUFACTURING SAME

(71) Applicant: Toshiba Memory Corporation, Minato-ku (JP)

(72) Inventors: Masahisa Sonoda, Yokkaichi (JP); Hisataka Meguro, Yokkaichi (JP); Hideaki Masuda, Nagoya (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/258,704

(22) Filed: Sep. 7, 2016

(65) Prior Publication Data
US 2017/0256562 A1    Sep. 7, 2017

Related U.S. Application Data

(60) Provisional application No. 62/302,854, filed on Mar. 3, 2016.

(51) Int. Cl.
*H01L 27/115* (2017.01)
*H01L 27/11582* (2017.01)
*H01L 23/528* (2006.01)
*H01L 27/11565* (2017.01)

(52) U.S. Cl.
CPC .... *H01L 27/11582* (2013.01); *H01L 23/5283* (2013.01); *H01L 27/11565* (2013.01)

(58) Field of Classification Search
CPC ........... H01L 27/11582; H01L 23/5283; H01L 27/11565
See application file for complete search history.

(56) References Cited

U.S. PATENT DOCUMENTS

| | | |
|---|---|---|
| 2014/0042520 A1 | 2/2014 | Lee et al. |
| 2014/0073099 A1 | 3/2014 | Park et al. |
| 2015/0001460 A1 | 1/2015 | Kim et al. |
| 2015/0054058 A1 | 2/2015 | Seol et al. |

*Primary Examiner* — Long Pham
(74) *Attorney, Agent, or Firm* — Oblon, McClelland, Maier & Neustadt, L.L.P.

(57) ABSTRACT

A method for manufacturing a semiconductor memory device includes forming a first insulating layer on a conductive layer; forming a second insulating layer on the first insulating layer, the second insulating layer including a first layer and a second layer having nitrogen and hydrogen bonds with higher density than a density thereof in the first layer; forming a third insulating layer on the second insulating layer; forming a semiconductor layer extending through the first insulating layer and the second insulating layer in a direction toward the third insulating layer from the conductive layer; selectively removing the second insulating layer to form a space, the first insulating layer being exposed in the space; forming the fourth insulating layer between the conductive layer and the first insulating layer, the fourth insulating layer being formed by thermally oxidizing the conductive layer through the first insulating layer in the space.

7 Claims, 11 Drawing Sheets

SEMICONDUCTOR MEMORY DEVICE AND METHOD FOR MANUFACTURING SAME

CROSS-REFERENCE TO RELATED APPLICATION

This application is based upon and claims the benefit of priority from U.S. Provisional Patent Application 62/302,854, filed on Mar. 3, 2016; the entire contents of which are incorporated herein by reference.

FIELD

Embodiments are generally related to a semiconductor memory device and a method for manufacturing the same.

BACKGROUND

A NAND semiconductor memory device that is provided with three-dimensionally arranged memory cells includes multiple electrode layers stacked on the source layer, and a semiconductor channel extending through the electrode layers. In such a semiconductor memory device, the electrode layers are formed, for example, by replacing sacrificial layers stacked on the source layer with metal layers. In this process, however, an insulating layer positioned between the source layer and the electrode layers may become thinner, and the breakdown voltage of the insulating layer may be reduced.

DETAILED DESCRIPTION

According to one embodiment, a method for manufacturing a semiconductor memory device includes forming a first insulating layer on a conductive layer; forming a second insulating layer on the first insulating layer, the second insulating layer including a first layer and a second layer, the second layer including nitrogen and hydrogen bonds with a higher density than a density of nitrogen and hydrogen bonds in the first layer; forming a third insulating layer on the second insulating layer; forming a semiconductor layer extending through the first insulating layer and the second insulating layer in a direction toward the third insulating layer from the conductive layer, the semiconductor layer being in contact with the conductive layer, and having an end portion in the third insulating layer; selectively removing the second insulating layer to form a space, the first insulating layer being exposed at the space; forming the fourth insulating layer between the conductive layer and the first insulating layer by thermally oxidizing the conductive layer through the first insulating layer in the space; and forming a metal layer in the space.

According to another embodiment, a semiconductor memory device includes a memory cell portion and a peripheral portion. The memory cell portion includes a plurality of electrode layers stacked in a first direction, and a columnar body extending through the electrode layers in the first direction. The columnar body includes a semiconductor layer extending in the first direction. The peripheral portion is provided around the memory cell portion, and includes first and second insulating layers stacked in the first direction. The second insulating layer includes nitrogen and hydrogen bonds with a higher density than a density of nitrogen and hydrogen bonds in the first insulating layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
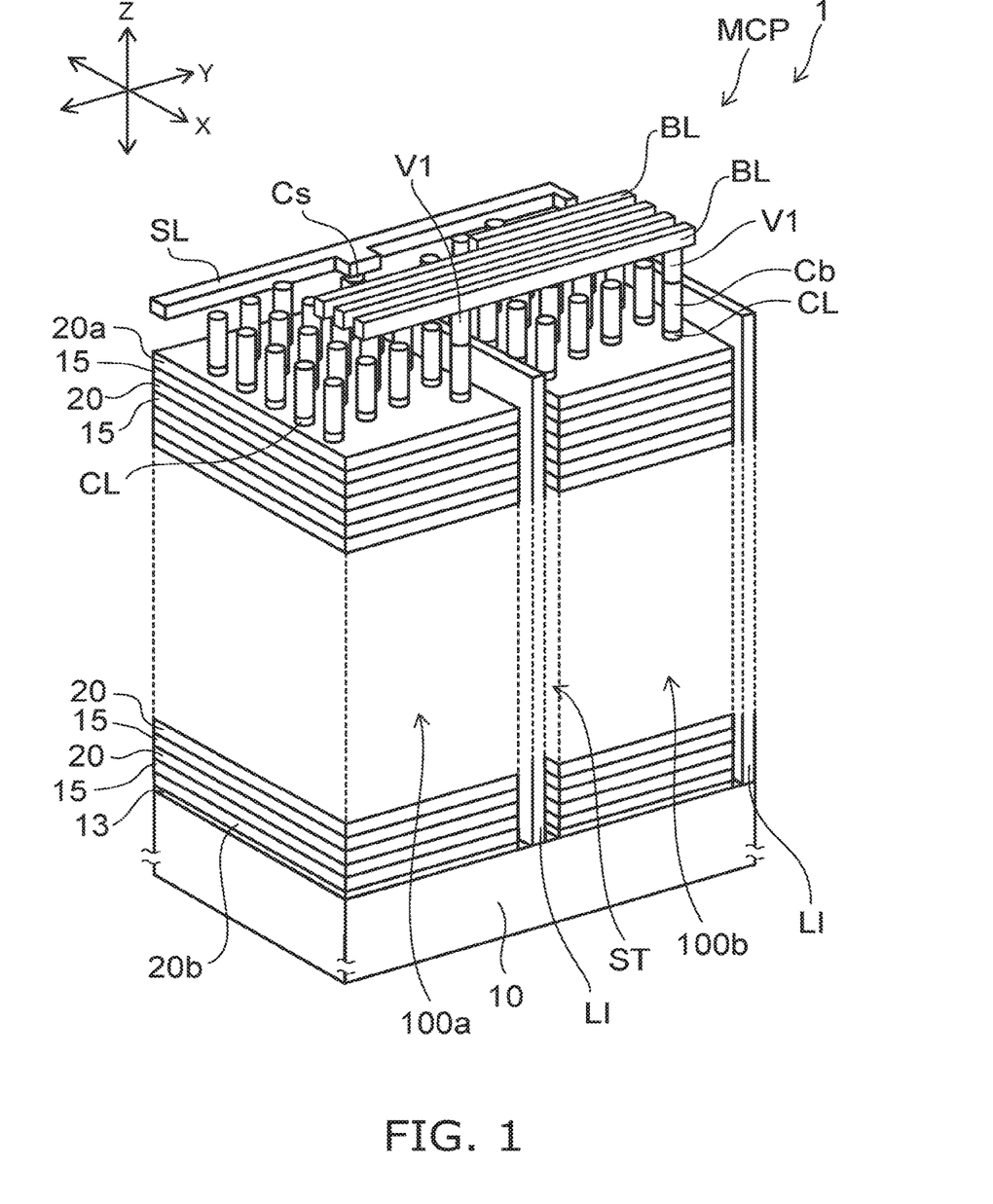
FIG. 1 is a perspective view schematically showing a semiconductor memory device according to an embodiment.

FIG. 1 is a perspective view schematically showing in the main a memory cell portion MCP of a semiconductor memory device 1 according to an embodiment. The semiconductor memory device 1 is, for example, a NAND type nonvolatile memory device and includes a three-dimensionally arranged memory cell.

As shown in FIG. 1, the semiconductor memory device 1 is provided with a conductive layer (hereinbelow, a source layer 10), a stacked body 100a and a stacked body 100b. The stacked bodies 100a and 100b are arranged in the Y-direction on the source layer 10. Each of the stacked bodies 100a and 100b includes multiple electrode layers 20 (e.g. control gates and word lines) and multiple insulating layers 15 stacked on the source layer 10 with an insulating layer 13 interposed. The electrode layers 20 and the insulating layers 15 are arranged alternately in a first direction (hereinbelow, the Z-direction), which is a stacking direction of the electrode layers 20. Each insulating layer 15 electrically insulates the adjacent electrode layers 20 from each other in the Z-direction.

Figure 2A:
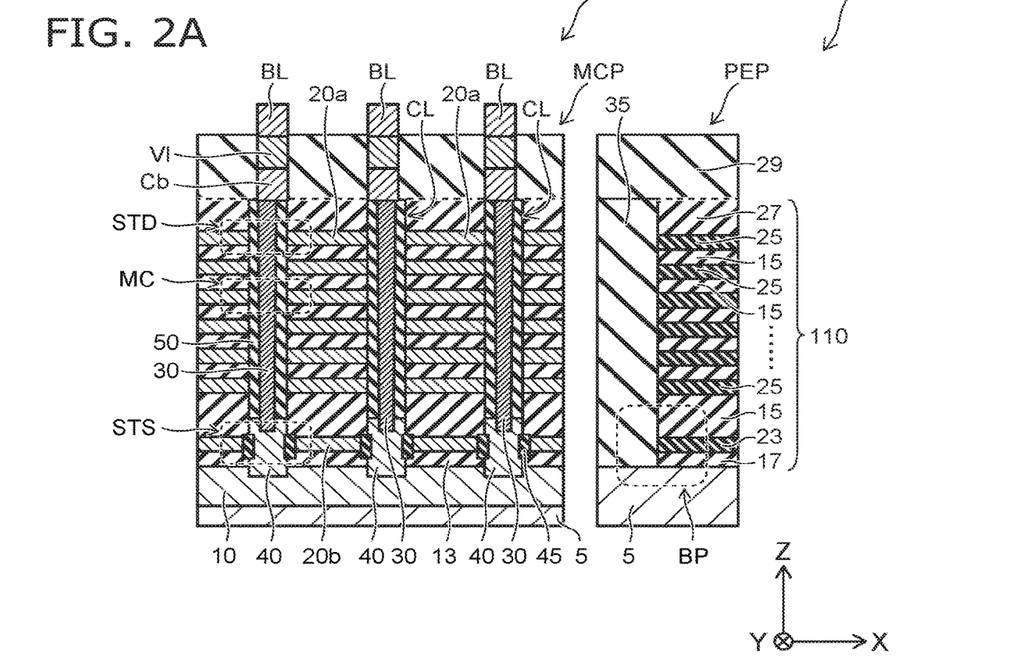
FIGS. 2A and 2B are schematic cross-sectional views of the semiconductor memory device according to the embodiment.

The source layer 10 is, for example, a P-type well provided in a silicon substrate (see FIG. 2A). Also, the source layer 10 may be a poly-crystalline silicon layer provided on the silicon substrate with an inter-layer insulating layer (not shown) interposed. The electrode layers 20 are, for example, metal layers including tungsten (W). The insulating layers 15 are, for example, silicon oxide layers.

Figure 2B:
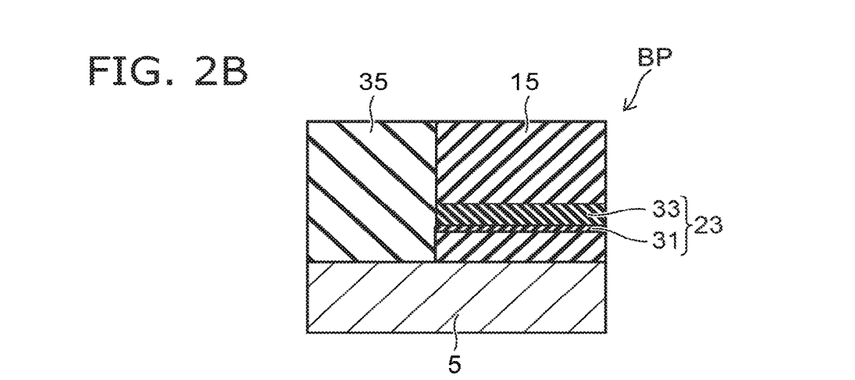

Each of the stacked bodies 100a and 100b includes columnar bodies CL extending in the Z-direction through the electrode layers 20 and the insulating layers 15 (see FIG. 2). Each of the columnar bodies CL is electrically connected to a bit line BL via contact plugs Cb and V1. The bit line BL extends, for example, in the Y-direction above the stacked bodies 100a and 100b. One of the columnar bodies CL provided in the stacked body 100a and one of the columnar bodies CL provided in the stacked body 100b share one bit line BL. For convenience in showing the structure of the semiconductor memory device 1, insulating layers 27 and 29 (see FIG. 2) are omitted in FIG. 1, which are provided between bit lines BL and an electrode layer 20a that is the uppermost layer of the electrode layers 20.

The semiconductor memory device 1 further includes a source line SL and source contact bodies LI electrically connected to the source layer 10. A source contact body LI is provided in a slit ST between the stacked body 100a and the stacked body 100b. The source contact body LI is, for example, a plate-shaped metal body extending in the X-direction and the Z-direction. Also, the source contact body LI is electrically connected to the source line SL via a contact plug Cs. In other words, the source line SL is electrically connected to the source layer 10 via the source contact bodies LI. The source line SL extends, for example, in the Y-direction above the stacked bodies 100a and 100b.

FIGS. 2A and 2B are schematic cross-sectional views showing the semiconductor memory device 1 according to the embodiment. FIGS. 2A and 2B are schematic views, for example, showing cross sections along the Y-Z plane of the stacked body 100. FIG. 2A is a cross-sectional view showing the memory cell portion MCP of the stacked body 100 and a peripheral portion PEP of the stacked body 100. FIG. 2B is a partial cross-sectional view showing the peripheral portion PEP. Hereinbelow, the stacked body 100a and 100b are referred to as the stacked body 100 without distinguishing each other.

As shown in FIG. 2A, the source layer 10 is provided selectively on a front surface side of a substrate 5. The substrate 5 is, for example, a silicon substrate and the source layer 10 is, for example, a P-type well. The source layer 10 is not provided in the peripheral portion PEP.

The columnar bodies CL extend in the Z-direction through the electrode layers 20 and the insulating layers 15 are provided in the memory cell portion MCP. Each of the columnar bodies CL includes a semiconductor layer 30, a semiconductor body 40 and an insulating layer 50. The semiconductor layer 30 extends in the Z-direction in each columnar body CL. The semiconductor body 40 is provided between the source layer 10 and the semiconductor layer 30. Then, the semiconductor body 40 is electrically connected to the source layer 10 and the semiconductor layer 30. The insulating layer 50 is positioned between the electrode layers 20 and the semiconductor layer 30, and extends in the Z-direction along the semiconductor layer 30. The semiconductor layer 30 is electrically connected to a bit line BL via contact plugs Cb and V1.

The semiconductor body 40 is provided so as to extend through an electrode layer 20b which is the lowermost layer of the electrode layers 20. The top end of the semiconductor body 40 is positioned at a level between the electrode layer 20b and the electrode layer 20 adjacent to the electrode layer 20b in the Z-direction. The bottom end of the semiconductor body 40 is positioned, for example, at a level lower than the front surface of the source layer 10. An insulating layer 45 is provided between the electrode layer 20b and the semiconductor body 40. The insulating layer 45 is, for example, a silicon oxide layer. The semiconductor body 40 is not limited to the example above, and may be provided, for example, to extend through the electrode layer 20b and the electrode layer 20 adjacent to the electrode layer 20b.

A selection transistor STS on a source-side, memory cells MC, and a selection transistor STD on a drain-side are provided in portions where the columnar body CL extends through the electrode layers 20 in the memory cell portion MCP. The selection transistor STS is provided, for example, at a portion where the semiconductor body 40 extends through the electrode layer 20b. The selection transistor STD is provided, for example, at a portion where the semiconductor layer 30 extends through the electrode layer 20a that is the uppermost layer. Each memory cell MC is provided at a portion where the semiconductor layer 30 extends through an electrode layer 20 between the selection transistor STS and the selection transistor STD. Thus, the semiconductor memory device 1 is provided with a NAND string that includes the selection transistors STS and STD and the memory cells MC arranged along the columnar body CL that extends in the Z-direction.

The semiconductor body 40 acts as the channel body of the selection transistor STS. The insulating layer 45, which is provided between the electrode layer 20b and the semiconductor body 40, acts as the gate insulating layer of the selection transistor STS. The electrode layer 20b acts as the selection gate electrode of the selection transistor STS.

The semiconductor layer 30 acts as the channel bodies of the memory cells MC and the selection transistor STD. The electrode layer 20a acts as the selection gate of the selection transistor STD. The electrode layers 20 positioned between the electrode layer 20a and the electrode layer 20b act as control gates of the memory cells MC.

For example, the insulating layer 50 has an ONO structure in which a silicon oxide, a silicon nitride, and another silicon oxide are stacked in order in a direction toward the semiconductor layer 30 from the electrode layers 20. The insulating layer 50 includes a portion, which acts as a charge storage portion, between each of the electrode layers 20 and the semiconductor layer 30. Alternatively, the insulating layer 50 may include a conductive body, which acts as a floating gate, between each of the electrode layers 20 and the semiconductor layer 30.

As shown in FIG. 2A, the peripheral portion PEP includes a stacked body 110. The stacked body 110 includes an insulating layer 17 and an insulating layer 23 provided on the substrate 5. The insulating layer 17 is provided on the insulating layer 23. Further, the stacked body 110 includes multiple insulating layers 15, multiple insulating layers 25 and an insulating layer 27. Each insulating layer 15 and each insulating layer 25 are stacked alternately in the Z-direction on the insulating layer 23. The insulating layer 27 is formed on an uppermost layer of the insulating layers 25. Also, an insulating layer 35 is provided between the stacked body 100 and the stacked body 110. The insulating layers 15, 17, 27 and 35 are, for example, silicon oxide layers. The insulating layers 23 and 25 are, for example, silicon nitride layers.

As shown in FIG. 2B, the insulating layer 23 includes, for example, a first layer 31 and a second layer 33. The second layer 33 is provided on the first layer 31 in the Z-direction. The insulating layer 23 contains, for example, hydrogen (H) bound to nitrogen (N). The first layer 31 contains nitrogen and hydrogen bonds (N—H) with a higher density than a density thereof in the second layer 33. A refractive index of the first layer 31 is greater than the refractive index of the second layer 33.

Figure 3:
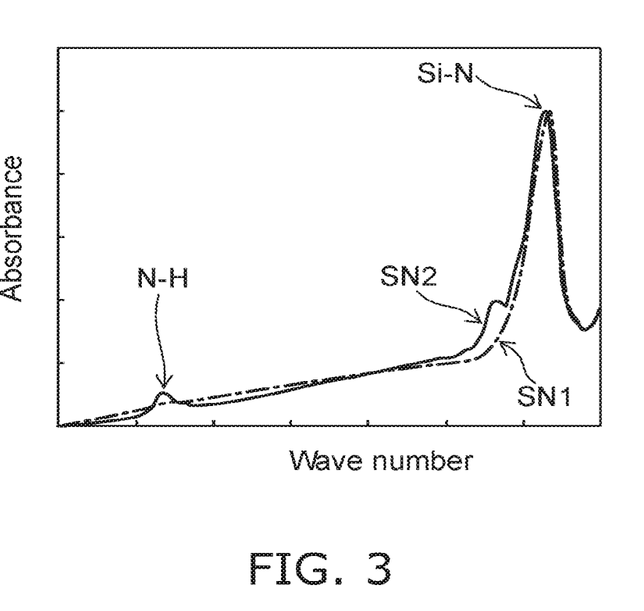
FIG. 3 is a graph showing characteristics of an insulating layer according to the embodiment.

FIG. 3 is a graph showing characteristics of the insulating layer 23 according to the embodiment. FIG. 3 shows Fourier transform infrared (FT-IR) spectroscopies of silicon nitride layers SN1 and SN2. The silicon nitride layer SN1 is formed, for example, by pressure reduced type thermal CVD (Chemical Vapor Deposition) using disilane ($Si_2H_6$) and ammonia ($NH_3$) as source materials. The silicon nitride layer SN2 is formed by, for example, plasma CVD using monosilane ($SiH_4$) and ammonia as source materials.

As shown in FIG. 3, a spectrum of the silicon nitride layer SN1 has a peak corresponding to a silicon and nitrogen bond (Si—N). On the other hand, a spectrum of the silicon nitride layer SN2 has a peak corresponding to the Si—N bond and a peak corresponding to the nitrogen and hydrogen bond (N—H). In the example shown in FIG. 3, a peak corresponding to the N—H bond is not found in the spectrum of the silicon nitride layer SN1.

For example, comparing a peak area of the N—H bond and a peak area of the Si—N bond in the FT-IR spectrum of the silicon nitride layer SN1, a ratio of the peak area of the N—H bond to the peak area of the Si—N bond is 1.0 percent. In contrast, in the FT-IR spectrum of the silicon nitride layer SN2, a ratio of the peak area of the N—H bond to the peak area of the Si—N bond is, for example, 5.7 percent. In other words, the silicon nitride layer SN2 contains 5.7 times (about 6 times) the N—H bonds in the silicon nitride layer SN1.

In the embodiment, the silicon nitride layer SN1 is, for example, used as the first layer 31 of the insulating layer 23, and the silicon nitride layer SN2 is, for example, used as the second layer 33 of the insulating layer 23. The first layer 31 is not limited to the example above, and may be a nitride silicon layer that is formed by CVD using monosilane and nitrogen as a source material, and that contains less N—H bonds than the second layer 33.

A method for manufacturing the semiconductor memory device 1 will now be described with reference to FIGS. 4A to 4I. FIGS. 4A to 4I are schematic cross-sectional views showing the manufacturing processes of the semiconductor memory device 1 according to the embodiment.

Figure 4A:
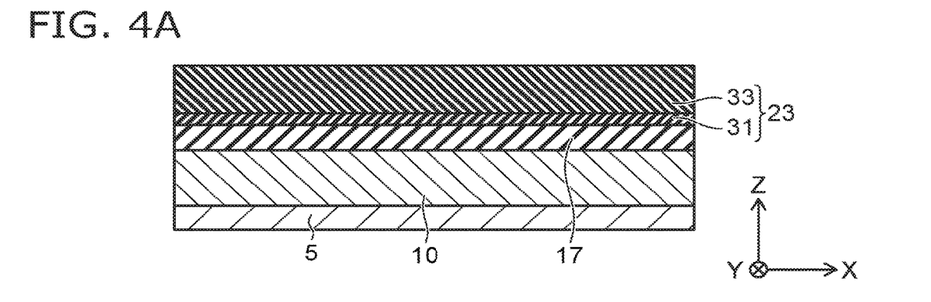
FIGS. 4A to 4I are schematic cross-sectional views showing a manufacturing processes of the semiconductor memory device according to the embodiment.

As shown in FIG. 4A, an insulating layer 17 and an insulating layer 23 are formed in order on the source layer 10 provided on the substrate 5. The insulating layer 17 may be, for example, a silicon oxide layer formed using thermal oxidization, or a silicon oxide layer deposited using CVD. This process is performed not only in the memory cell portion MCP of the semiconductor memory device 1 shown in FIG. 1, but also performed simultaneously in a hook-up portion HUP and in the peripheral portion PEP (see FIG. 4C described below). The hook-up portion HUP serves as a contact region of the electrode layers that act as control gates of the memory cells MC.

The insulating layer 23 on the insulating layer 17 includes the first layer 31 and the second layer 33. The firs layer 31 is a silicon nitride layer formed, for example, by the pressure reduced type thermal CVD using disilane and ammonia as source gases. Disilane and ammonia are thermally decomposed in the pressure reduced type thermal CVD, and silicon nitride made by combining silicon atoms of the disilane and nitrogen atoms of the ammonia is supplied above and deposited on the insulating layer 17.

Moreover, the first layer 31 may be a silicon nitride layer formed, for example, by plasma CVD using monosilane and nitrogen as a source gas. In such a case, a source gas containing monosilane and nitrogen without ammonia is used. Silicon atoms and nitrogen atoms dissociated by plasma excited in atmosphere of this source gas are combined into silicon nitride, and the silicon nitride is deposited on the insulating layer 17. Monosilane and nitrogen may be supplied, for example, as a diluted gas with an inert gas such as Argon (Ar). A monosilane gas diluted with nitrogen may also be supplied as a source material.

The second layer 33 is a silicon nitride layer formed, for example, by plasma CVD using monosilane and ammonia as source gases. The second layer 33 includes a silicon nitride that is formed by combining silicon atoms and nitrogen atoms dissociated by plasma excited in the atmosphere including the source gas. The source gas of plasma CVD may be, for example, a monosilane and ammonia diluted with an inert gas.

The second layer 33 contains, for example, the N—H bond which is dissociated from ammonia or the N—H bond in which a dangling bond is terminated by hydrogen. Also, a number of the N—H bonds per unit volume included in the second layer 33 is, for example, larger than a number of the N—H bonds per unit volume included in the first layer 31 formed by the method described above.

In case where both the first layer 31 and the second layer 33 are formed by plasma CVD, it is preferable that a ratio of monosilane to nitrogen in the source gas that forms the first layer 31 is larger than a ratio of monosilane to a sum of ammonia and inert gas in the source gas that forms the second layer 33. Thereby, it is possible to form the first layer 31 including less number of the N—H bonds.

Figure 4B:
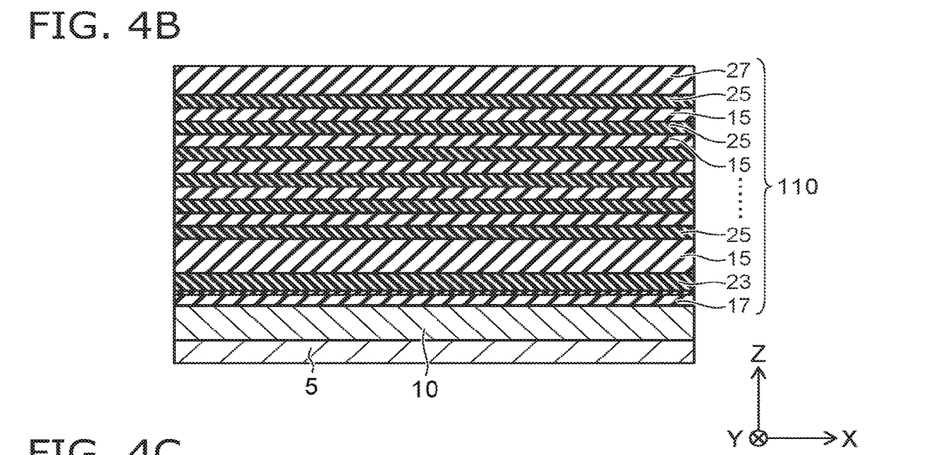

As shown in FIG. 4B, multiple insulating layers 15, multiple insulating layers 25 and an insulating layer 27 are stacked on the insulating layer 23. An insulating layer 15 that is the lowermost layer of the insulating layers 15 is formed on the insulating layer 23, and each insulating layer 15 and each insulating layer 25 are stacked alternately in the Z-direction. The insulating layer 27 is formed on an insulating layer 25 that is the uppermost layer of the insulating layers 25. Hereinafter, a multilayered structure that includes the insulating layers 17, 23, 15, 25 and 27 will be referred to as the stacked body 110.

The insulating layers 15 and 27 are, for example, silicon oxide layers. The insulating layers 15 and 27 are formed, for example, by plasma CVD using monosilane and nitrogen monoxide as a source gas. The insulating layer 25 is a silicon nitride layer formed, for example, by plasma CVD using monosilane and ammonia as a source gas. A number of the N—H bonds per unit volume included in the insulating layer 25 are larger than the number of the N—H bonds per unit volume included in the first layer 31.

Figure 4C:
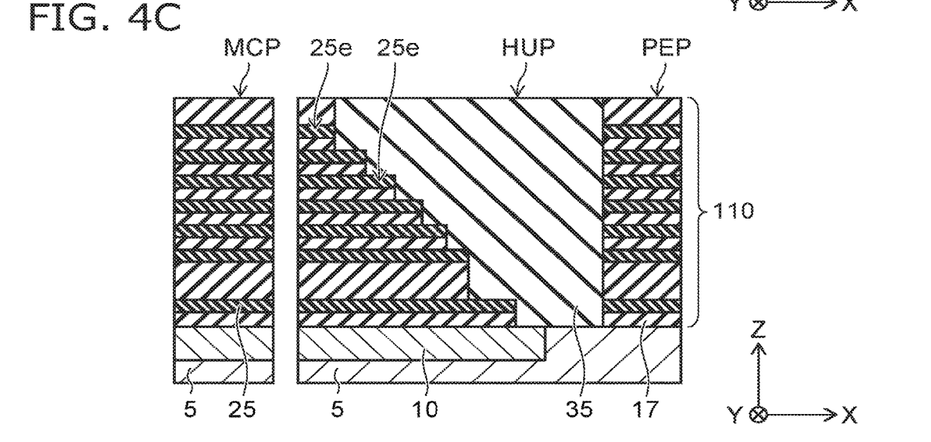

FIG. 4C is a schematic view showing cross sections of the memory cell portion MCP, the hook-up portion HUP, and the peripheral portion PEP. The hook-up portion HUP is provided, for example, between the memory cell portion MCP and the peripheral portion PEP. As shown in FIG. 4C, the stacked body 110 is divided at the hook-up portion HUP. The end portions 25e of the insulating layers 25 on the memory cell portion MCP side are formed into stairs. Then, the insulating layer 35 is formed so as to cover the hook-up portion HUP. The insulating layer 35 is, for example, a silicon oxide layer formed using CVD.

Figure 4D:
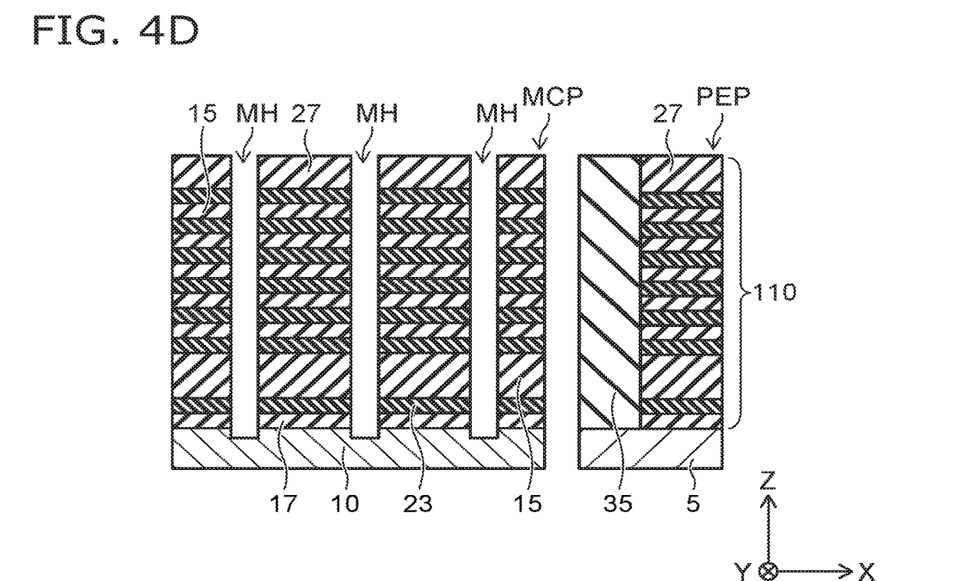

FIG. 4D is a schematic view showing partial cross sections of the memory cell portion MCP and the peripheral portion PEP.

As shown in FIG. 4D, memory holes MH are formed from the top surface of the stacked body 110 with a depth capable of reaching the source layer 10. The memory holes MH are formed, for example, by selectively removing the insulating layers 27, 25, 15 and 17 using anisotropic RIE. The source layer 10 is exposed at the bottoms of the memory holes MH.

Figure 4E:
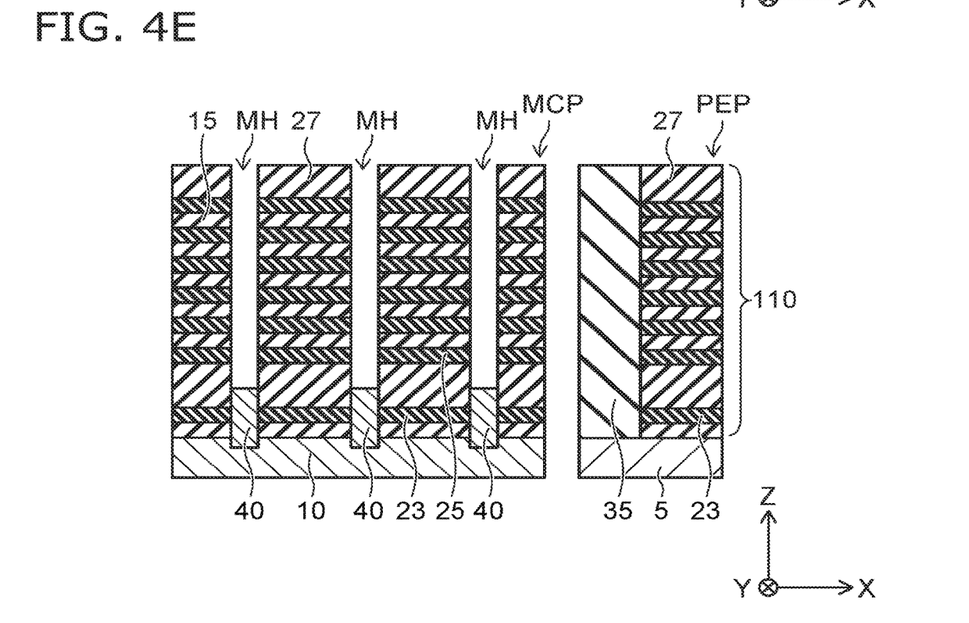

As shown in FIG. 4E, semiconductor bodies 40 are formed in the bottom portions of the memory holes MH. The semiconductor bodies 40 are, for example, silicon layers epitaxially grown on the source layer 10. The semiconductor bodies 40 have, for example, a monocrystalline structure. The semiconductor bodies 40 are formed so that the top ends thereof are positioned between the insulating layer 23 and an insulating layer 25 that is the lowermost layer of the insulating layers 25 stacked in the Z-direction.

Figure 4F:
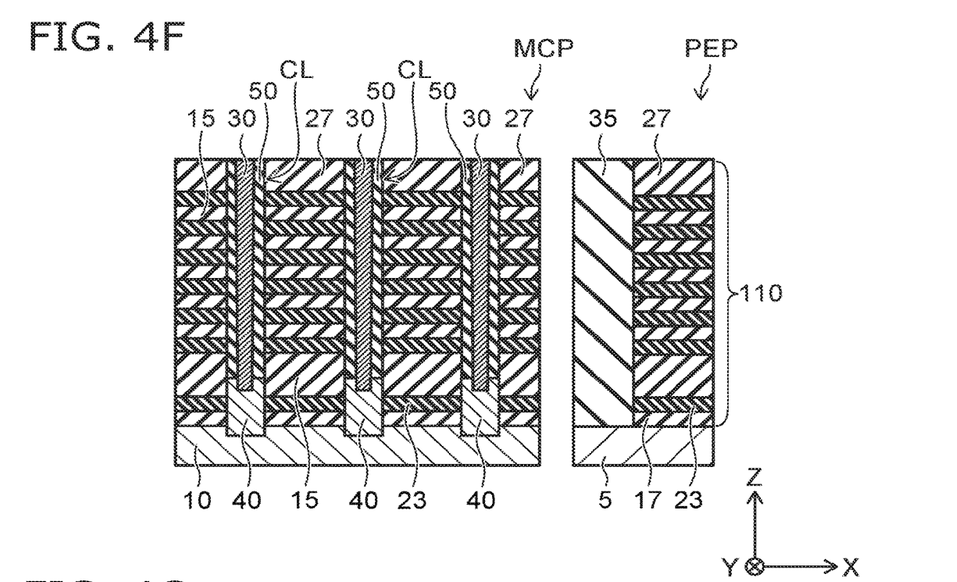

As shown in FIG. 4F, the columnar bodies CL are formed in the memory holes MH. A columnar body CL includes, for example, an insulating layer 50, a semiconductor layer 30 and a semiconductor body 40. The semiconductor layer 30 is formed so as to extend in the Z-direction in the columnar body CL. The semiconductor layer 30 is electrically connected to the semiconductor body 40 at the bottom end of the semiconductor layer 30. The semiconductor layer 30 is, for example, a polycrystalline silicon layer formed using CVD. The insulating layer 50 is positioned between an inner wall of the memory hole MH and the semiconductor layer 30. The insulating layer 50 has a structure in which a silicon oxide layer, a silicon nitride layer, and a silicon oxide layer are stacked in order in the direction toward the semiconductor layer 30 from the inner wall of the memory hole MH. The insulating layer 50 is formed, for example, using CVD.

Figure 4G:
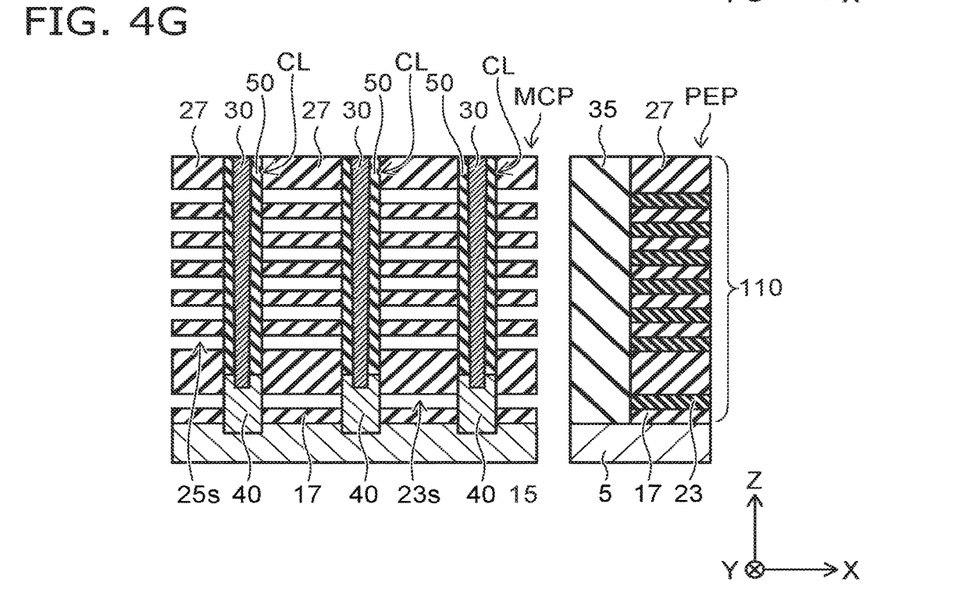

As shown in FIG. 4G, in the memory cell portion MCP, spaces 23s and 25s are formed in the stacked body 110 by selectively removing the insulating layers 23 and 25. The insulating layers 23 and 25 are removed, for example, by supplying etching solution via slits ST that divide the stacked body 110 (see FIG. 1). In a case where silicon nitride layers are used as the insulating layers 23 and 25, for example, the insulating layers 23 and 25 may be removed selectively by a hot phosphoric acid solution. On the other hand, no slit ST is formed in the peripheral portion PEP, and thus, insulating layers 23 and 25 are maintained in the stacked body 110.

Figure 4H:
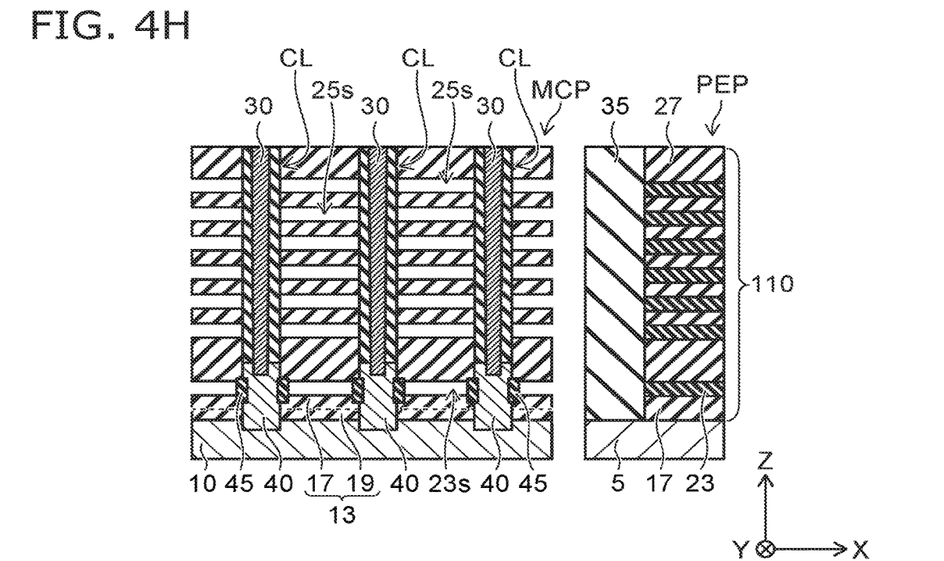

As shown in FIG. 4H, insulating layers 45 are formed on the lateral surfaces of the semiconductor bodies 40 exposed in the space 23s. The insulating layers 45 are formed, for example, by thermal oxidation of the semiconductor bodies 40. The insulating layers 45 are, for example, silicon oxide layers.

Further, in the process of thermal oxidation of the semiconductor bodies 40, the insulating layer 13 is formed on the source layer 10. The insulating layer 13 includes the insulating layer 17 and an insulating layer 19. The insulating layer 19 is formed by thermally oxidizing the source layer 10 through the insulating layer 17. In other words, the insulating layer 13 is an insulating layer 17 that has a thickness increased by the thermal oxidation on the source layer 10.

For example, it is preferable to provide surface etching for the insulating layers 15, 17 and 50, which are exposed in the spaces 23s and 25s, using a hydrogen fluoride solution as a treatment after removing the insulating layers 23 and 25 shown in FIG. 4G. Furthermore, it is desirable in the process of thermal oxidation described above to increase a thickness of the insulating layer 17, which is reduced by the surface etching, and to improve the breakdown voltage thereof.

Figure 4I:
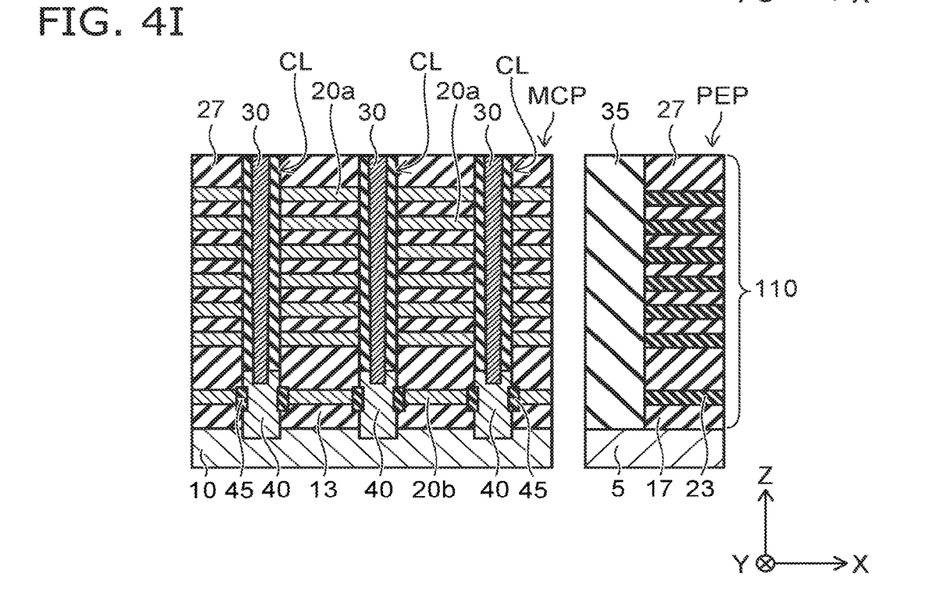

As shown in FIG. 4I, the electrode layers 20 are formed in the spaces, where the insulating layers 23 and 25 are removed (see FIG. 3H), so as to complete the stacked body 100. The electrode layers 20 are, for example, metal layers which are deposited in the spaces 23s and 25s by CVD. Each electrode layer 20 includes, for example, a barrier metal layer (not shown) and a high-melting-point metal layer such as tungsten. The barrier metal layer is, for example, titanium nitride (TiN) formed between the insulating layer 15 and the high-melting-point metal layer, between the insulating layer 13 and the high-melting-point metal layer, and between the columnar body CL and the high-melting-point metal layer.

Then, the bit lines BL and the source line SL are formed on the insulating layer 27 with the insulating layer 29 interposed, so as to complete the semiconductor memory device 1 (see FIG. 2). The semiconductor layer 30 is electrically connected to one of bit lines BL via contact plugs Cb and V1.

Figure 5A:
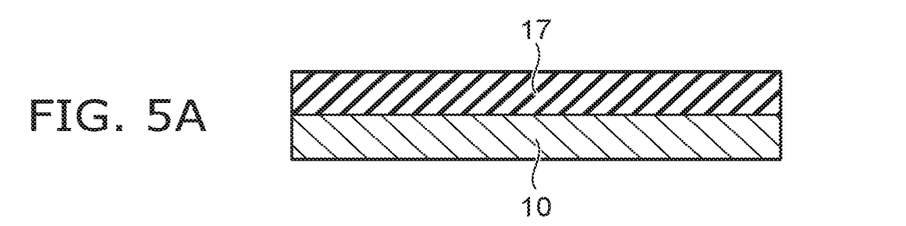
FIGS. 5A to 5C are schematic cross-sectional views showing a portion of a manufacturing processes of the semiconductor memory device according to comparative example.
Figure 5B:
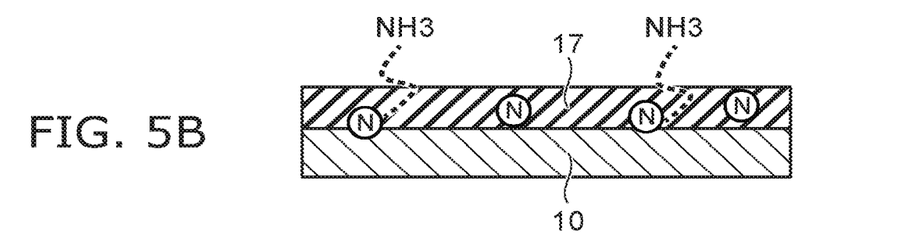
Figure 5C:
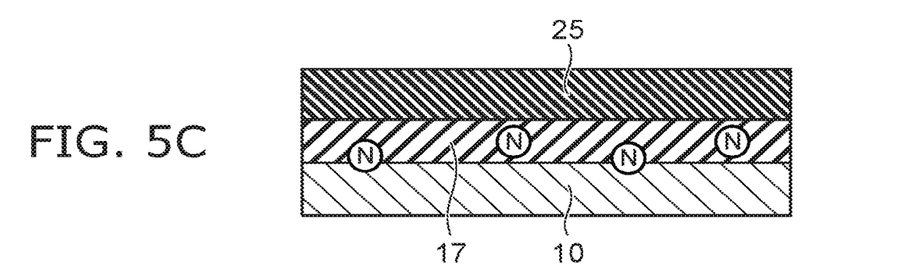

A method for manufacturing the semiconductor memory device according to a comparative example will now be described with reference to FIGS. 5A to 5C. FIGS. 5A to 5C are schematic cross-sectional views showing a process of forming an insulating layer 25 on the insulating layer 17. As shown in FIG. 5A, after the insulating layer 17 is formed on the source layer 10, the insulating layer 25 is deposited on the front surface of the insulating layer 17 by plasma CVD using a source gas containing monosilane and ammonia.

As shown in FIG. 5B, nitrogen atoms are dissociated from the ammonia in a plasma, and penetrate into the insulating layer 17. This process continues during the deposition process of the insulating layer 25. Then, as shown in FIG. 5C, the nitrogen atoms are accumulated at the interface between the source layer 10 and the insulating layer 17.

Figure 6A:
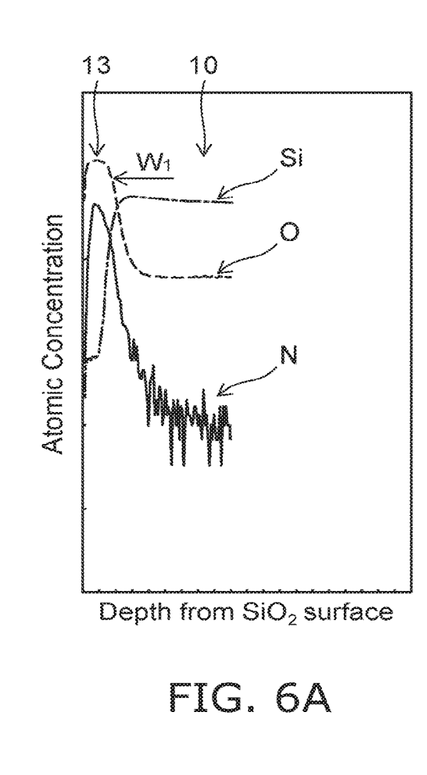
FIGS. 6A and 6B are Secondary Ion Mass-Spectrometry (SIMS) profiles showing structures of the insulating layer according to the embodiment and the comparative example.
Figure 6B:
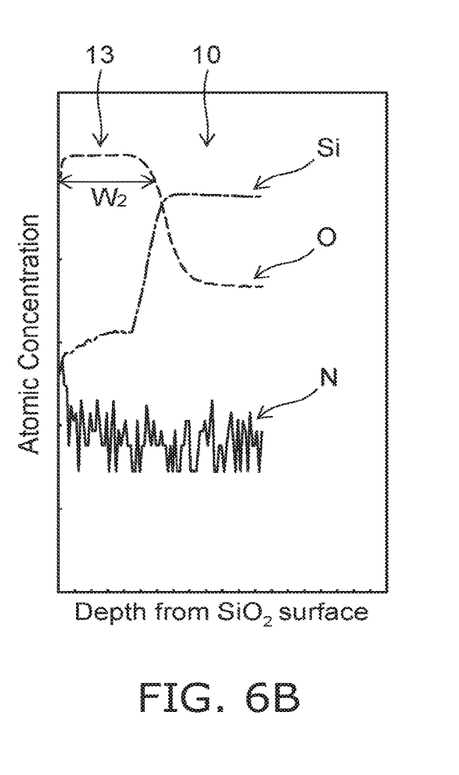

FIG. 6A is a SIMS profile of the insulating layer 13 formed on the source layer 10 using the manufacturing method according to the comparative example. FIG. 6B is a SIMS profile of the insulating layer 13 formed using the manufacturing method according to the embodiment.

The vertical axis is atomic concentration, and the horizontal axis is a depth from $SiO_2$ surface, i.e. the front surface of the insulating layer 13, for example. FIGS. 6A and 6B shows concentration profiles of silicon atoms, oxygen atoms, and nitrogen atoms, respectively. The insulating layer 13 shown here includes the insulating layer 17 and the insulating layer 19 (see FIG. 4H).

In the example shown in FIG. 6A, the insulating layer 13 has a layer thickness $W_1$. On the other hand, the insulating layer 13 has a layer thickness $W_2$ in the example shown in FIG. 6B. The layer thickness $W_2$ is thicker than the layer thickness $W_1$. The layer thickness of the insulating layer 17 included in the insulating layer 13 is the same in the example shown in FIG. 6A as in the example shown in FIG. 6B. Accordingly, the insulating layer 13 shown in FIG. 6B includes the insulating layer 19 thicker than the insulating layer 19 included in the insulating layer 13 shown in FIG. 6A. In other words, it is found that the thermal oxidation of the source layer 10 through the insulating layer 17 is suppressed in the manufacturing method according to the comparative example.

As shown in FIG. 6A, it is found that the nitrogen atoms are contained in the insulating layer 13, since there is a peak of nitrogen (N) atom in a range of the layer thickness of the insulating layer 13, which is formed by the manufacturing method according to the comparative example. On the other hand, as shown in FIG. 6B, it is found that almost no nitrogen atom is contained in the insulating layer 13, because there is no peaks of the nitrogen (N) atom in a range of the layer thickness of the insulating layer 13, which is formed using the manufacturing method according to the embodiment. For example, the nitrogen atoms, which exist at the interface between the source layer 10 and the insulating layer 17 and in the insulating layer 17 (see FIG. 5C), are combined with the silicon atoms in the source layer 10 by thermal annealing in the manufacturing process after the insulating layer 25 is formed. Then, the nitrogen atoms combined the silicon atoms in the source layer 10 suppress thermal oxidization thereof.

In the manufacturing method according to the embodiment, in the process of forming the insulating layer 23 on the insulating layer 17, the second layer 33 is formed by plasma CVD using with a source gas containing monosilane and ammonia on the first layer 31 into which the nitrogen atoms hardly penetrates. Thereby, it is possible to suppress the nitrogen atoms penetrating into the insulating layer 17, and to reduce the bonds of the silicon atom and the nitrogen atom in the source layer 10. As a result, it is possible to reduce the influence of the nitrogen atom on the thermal oxidation of the source layer 10.

Figure 7:
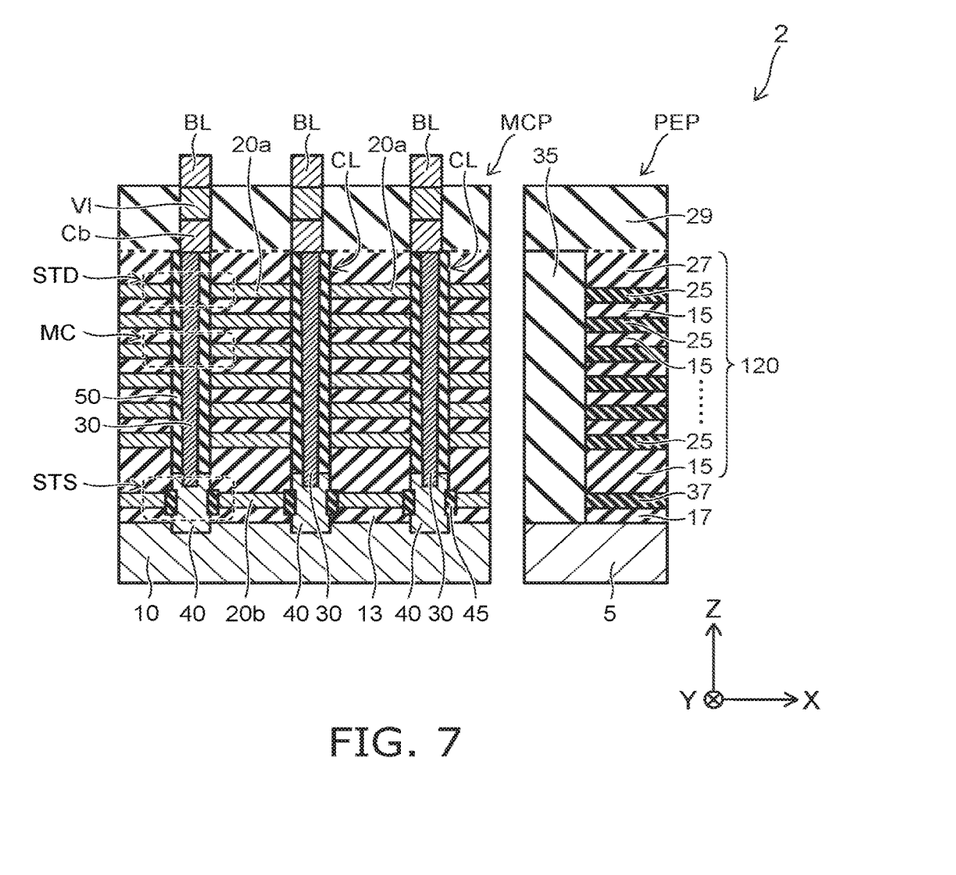
FIG. 7 is a perspective view schematically showing a semiconductor memory device according to a variation of the embodiment.

FIG. 7 is a schematic cross-sectional view showing a semiconductor memory device 2 according to a variation of the embodiment. The semiconductor memory device 2 is provided with multiple electrode layers 20 stacked on the source layer 10 and columnar bodies CL in the memory cell portion MCP. A columnar body CL includes the semiconductor layer 30 and the semiconductor body 40, and is provided to extend through the electrode layers 20 in the Z-direction. Moreover, the semiconductor memory device 2 includes the NAND string including the selection transistors STS and STD and multiple memory cells MC provided along the columnar body CL.

Further, the semiconductor memory device 2 includes a stacked body 120 in the peripheral portion PEP. The stacked body 120 includes an insulating layer 37 and an insulating layer 17 provided on a substrate 5. The insulating layer 37 is provided on the insulating layer 17. Further, the stacked body 120 includes multiple insulating layers 15, multiple insulating layers 25 and an insulating layer 27. Each insulating layer 15 and each insulating layer 25 are stacked alternately on the insulating layer 37. The insulating layer 27 is formed on an insulating layer 25 that is the uppermost layer of the insulating layers 25.

The insulating layer 25 includes N—H bonds more than the insulating layer 37. In other words, a number of the N—H bonds per unit volume included in the insulating layer 25 are larger than a number of the N—H bonds per unit volume included in the insulating layer 37.

The insulating layer 25 is a silicon nitride layer formed, for example, by plasma CVD using a source gas containing monosilane and ammonia. The insulating layer 37 is a silicon nitride layer formed, for example, by pressure reduced type thermal CVD using disilane and ammonia as source materials. The insulating layer 37 may be a silicon nitride layer formed by plasma CVD using a source gas containing monosilane and nitrogen without ammonia.

In this example, the insulating layer 37 is provided in place of the insulating layer 23 shown in FIG. 2. That is, the insulating layers 25 and 37 are selectively removed in the manufacturing process corresponding to the selective etching of the insulating layer 23 and the insulating layer 25 shown in FIG. 4G. Then, the insulating layer 45 is formed on the side surface of the semiconductor body 40 via a space where the insulating layer is removed in the manufacturing process corresponding to FIG. 4H.

The insulating layer 37 suppresses nitrogen atoms penetrating into the insulating layer 17 in the formation process thereof. Thereby, it is possible to reduce the influence of the nitrogen atom on the thermal oxidation of the source layer 10 in the process of forming the insulating layer 45. As a result, it is possible to increase the layer thickness of the insulating layer 13 in the memory cell portion MCP and to improve the breakdown voltage between the source layer 10 and an electrode layer 20 that is the lowermost layer.

There may be a case, however, where the insulating layer 37 has an etching rate smaller than that of the insulating layer 25 under the etching condition used for the selective etching described above. Thus, the etching of insulating layer 37 is continued after the insulating layer 25 is removed. In other words, over-etching is performed in the space where the insulating layer 25 is removed. Accordingly, it is preferable to reduce the difference in the etching rate between the insulating layer 25 and the insulating layer 37 so as to suppress a generation of structure defects and like due to the over-etching.

For example, in the manufacturing process of the semiconductor memory device 1 shown in FIG. 4G, the insulating layer 23 includes the first layer 31 and the second layer 33, and the first layer 31 has an etching rate smaller than that of the insulating layer 25. Thereby, the difference may be reduced in the etching rate between the insulating layer 23 and the insulating layer 25. The second layer 33 may be formed, for example, by the same method and condition as the insulating layer 25, and may be formed to have the same etching rate as the insulating layer 25. In other words, it is possible to make the etching rate of the insulating layer 23 closer to the etching rate of the insulating layer 25 by reducing a layer thickness of the first layer 31 so as to be relatively thin in the insulating layer 23.

Figure 8:
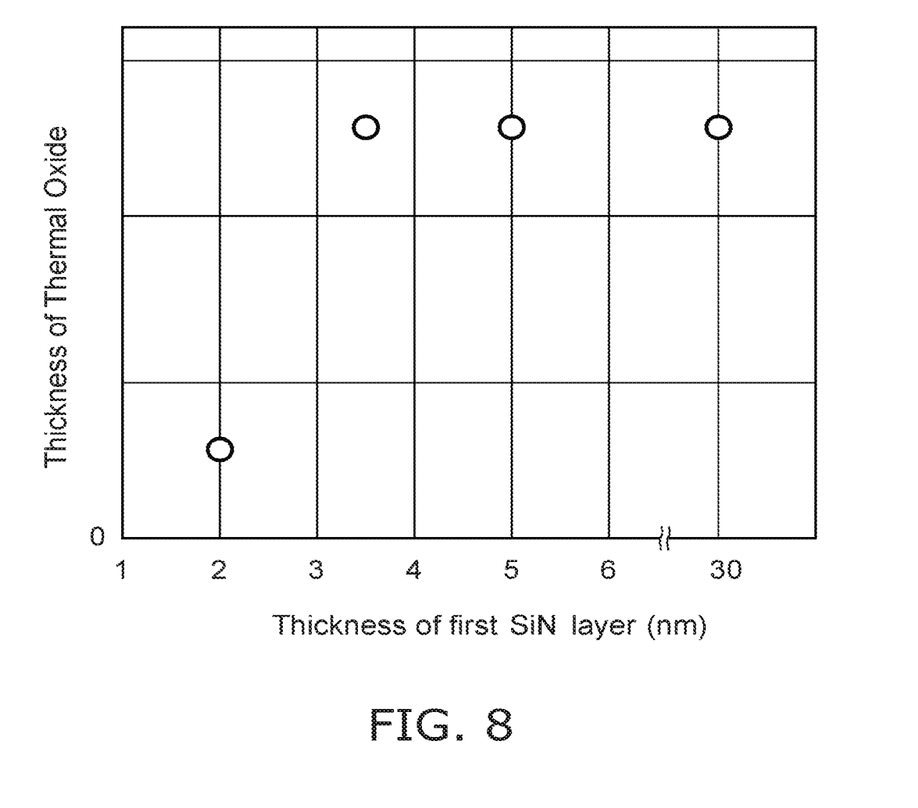
FIG. 8 is a graph showing other characteristics of an insulating layer according to the embodiment.

FIG. 8 is a graph showing a thickness of thermal oxide versus a thickness of first SiN layer. The vertical axis represents, for example, the layer thickness of the insulating layer 19 (see FIG. 4H) formed by thermal oxidation of the source layer 10, and the horizontal axis represents, for example, the layer thickness of the first layer 31.

As shown in FIG. 8, for example, the layer thickness of the insulating layer 19 is constant, when the layer thickness of the first layer 31 exceeds 3 nm (nanometers). That is, the influence of the nitrogen atom on the thermal oxidation of the source layer 10 cannot be ignored when the layer thickness of the first layer 31 is less than 3 nm. Accordingly, it is preferable for the first layer 31 to have a layer thickness of 3 nm or more. Also, it is favorable for the first layer 31 to have the layer thickness of 3.5 nm or more. Also, it is preferable for the first layer 31, for example, to have the layer thickness not more than 10% of the layer thickness of the insulating layer 23, from the viewpoint of reducing the difference in etching rate between the insulating layer 23 and the insulating layer 25.

In the embodiment described above, the peripheral portion PEP is not limited to the portion adjacent to the hook-up portion HUP (see FIG. 4C), and may be a portion, for example, around the memory cell portion MCP, where the insulating layer 23 or the insulating layer 37 is not replaced with a metal layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor memory device comprising:
   a memory cell portion including:
      a plurality of electrode layers stacked in a first direction; and a columnar body extending through the electrode layers in the first direction and including a semiconductor layer extending in the first direction; and a peripheral portion provided around the memory cell portion, and including first and second insulating layers stacked in the first direction, the second insulating layer including nitrogen and hydrogen bonds with a higher density than a density of nitrogen and hydrogen bonds in the first insulating layer.

2. The semiconductor memory device according to claim 1, wherein the first insulating layer includes a first layer and a second layer, wherein the second layer is positioned between the first layer and the second insulating layer, and the second layer and the second insulating layer include nitrogen and hydrogen bonds with a higher density than a density of nitrogen and hydrogen bonds in the first layer.

3. The semiconductor memory device according to claim 2, wherein the first layer has a layer thickness of 3 nm or more in the first direction.

4. The semiconductor memory device according to claim 1, wherein the memory cell portion further includes a third insulating layer provided between adjacent electrode layers of the electrode layers, the peripheral portion further includes a fourth insulating layer provided between the first insulating layer and the second insulating layer, and the fourth insulating layer includes a same material as a material of the third insulating layer.

5. The semiconductor memory device according to claim 4, wherein the first insulating layer and the second insulating layer are silicon nitride layers, and the third insulating layer and the fourth insulating layer are silicon oxide layers.

6. The semiconductor memory device according to claim 1, wherein the memory cell portion further includes a conductive layer adjacent to the electrode layers in the first direction, the conductive layer being electrically connected to the semiconductor layer, the semiconductor layer includes a first semiconductor portion extending in the first direction and a second semiconductor portion positioned between the first semiconductor portion and the conductive layer, and the memory cell portion includes a charge storage portion positioned between the first semiconductor portion and one of the electrode layers, the first semiconductor portion extending through the one of the electrode layers.

7. The semiconductor memory device according to claim 6, wherein the first insulating layer is positioned at the same level as another one of the electrode layers adjacent to the conductive layer.

* * * * *